United States Patent [19]

Sandner et al.

[11] Patent Number: 5,314,133
[45] Date of Patent: May 24, 1994

[54] SUPPLY APPARATUS FOR COLOR-BEARING FILM

[75] Inventors: Helmut G. Sandner; Peter Ulrich, both of Rodgau; Robert N. Francois, Wehrheim, all of Fed. Rep. of Germany; Michael Hawkins, Halifax, United Kingdom

[73] Assignee: E. I. Du Pont de Nemours and Company, Wilmington, Del.

[21] Appl. No.: 876,935

[22] Filed: May 1, 1992

[30] Foreign Application Priority Data

May 2, 1991 [DE] Fed. Rep. of Germany ....... 4114314

[51] Int. Cl.$^5$ .............................................. G03B 1/04
[52] U.S. Cl. .............................. 242/67.3 R; 242/71.2
[58] Field of Search ................. 242/67.3 R, 71.2, 199; 354/341

[56] References Cited

U.S. PATENT DOCUMENTS

| | | | |
|---|---|---|---|
| 3,138,081 | 6/1964 | Nerwin | 242/71.2 |
| 3,450,531 | 6/1969 | Amidon et al. | 430/291 |
| 3,701,495 | 10/1972 | Holliday | 242/71.2 X |
| 3,836,091 | 9/1974 | Hurtig et al. | 242/71.2 |
| 4,019,434 | 4/1977 | Hoexter | 101/216 |
| 4,534,666 | 8/1985 | Watanabe | 400/207 |
| 5,153,625 | 10/1992 | Weber | 242/71.2 X |

FOREIGN PATENT DOCUMENTS

| | | |
|---|---|---|
| 0255032 | 7/1987 | European Pat. Off. . |
| 3421925 | 12/1984 | Fed. Rep. of Germany . |
| 3535767 | 4/1986 | Fed. Rep. of Germany . |
| 0014490 | of 1908 | United Kingdom ............... 242/71.2 |
| 0250415 | 4/1926 | United Kingdom ............... 242/71.2 |

Primary Examiner—Peter Nerbun

[57] ABSTRACT

A color film supply apparatus has a supply roll holding unused color film. The apparatus simplifies the handling of the color film. For this purpose, the supply roll and a waste roll to hold used film are supported in a cassette-type, portable housing in a manner such that a length of the color film extends between the supply roll and the waste roll and the housing has, between the supply roll and the waste roll, an opening that is at least as wide as the color film and permits free access to both sides of the color film. In addition, a straight edge is located in the section of the housing containing the waste roll and deflects the travel path of the color film.

19 Claims, 4 Drawing Sheets

SUPPLY APPARATUS FOR COLOR-BEARING FILM

BACKGROUND OF THE INVENTION

1. Field of the Invention

The subject of the invention is a supply apparatus for color-bearing film with a supply roll to hold unused color-bearing film.

2. Description of Related Art

For proofing color separations in the printing field, the surface of an image-bearing film is made tacky, for example, by exposure of areas on which a color will be applied. The image-bearing film is then brought into contact with a color-bearing film, or "color film" for short, by a laminator. The laminator has a nip formed by two rollers. In this nip, the color film is pressed against the image-bearing film. Beyond the nip, the color film is separated from the image-bearing film. In this manner, the color remains adhered to the previously tacky areas. The process is repeated with the appropriate number of colors, usually four. Thus, the color separation can be inspected visually, particularly whether the resolution is right.

In known laminators, the supply apparatus for color films consists of a series of color film supply rolls suspended before the nip. The ends of the color films hang down and are fastened on each supply roll, for example, by an adhesive strip. To make a color separation, a technician grasps the end of the film of the desired color, pulls a length of it off the supply roll and threads the end into the nip, for example, with the assistance of a stream of air. The image-bearing film is then similarly threaded into the roller nip. The nip is closed and lamination can start. As soon as the image-bearing film has passed through the nip, the nip is re-opened. The used color film is separated from the supply roll, for example, with a knife. The supply roll is rotated in a direction opposite to the unwind direction in order to backwind any remaining excess of color film. The color film adhering to partial areas of the image-bearing film is then pulled away from the image-bearing film. The used color film is waste.

The manipulation of the color films is relatively cumbersome. The repeated back and forth winding of the color films on the supply rolls can result in some color being rubbed off the film, leading to a defective color separation. Finally, handling of the used film is troublesome. The used color film sheets not only occupy a relatively large space as waste, but they are also difficult to recycle. Moreover, some effort and dexterity are required to separate the color film from the image-bearing film.

SUMMARY OF THE INVENTION

The invention is based on the problem of simplifying the manipulation of the color film.

This problem is solved by a supply apparatus for color films having a supply roll and a waste roll for receiving used film positioned in a cassette-type, portable housing, in a manner such that a length of color film is extended between the supply roll and the waste roll. The housing has an opening between the supply roll and the waste roll at least as wide as the color film and permits free access to both sides of the color film. A straight edge is located in the section of the housing containing the waste roll and deflects the travel path of the color film.

The supply rolls for the color films do not hang in the opening on the inlet side of the laminator. Rather, the supply rolls are located in cassettes. Each such cassette serves not only to dispense fresh or unused color film, but also simultaneously to wind used color film on the waste roll. The used color film is thus held compactly in a roll. The waste roll can then be easily recycled. The cassette opening, which is at least as wide as the color films, permits the laminator to be operated exactly as with open supply rolls, despite the cassette. Both rollers forming the nip can be brought to bear on the color film or the image-bearing film from above and below, because the opening gives them free access to both sides of the color films. This enables winding up the color film immediately beyond the nip, thus resulting in automatically separating the color film from the image-bearing film. The technician is thereby relieved of this process step. With the cassette, only as much film as is required for the actual lamination step is unwound from the supply roll. Backwinding unused color film is thus superfluous. As a result, the color film sustains less damage than previously. The color film leader, that is, the length of color film needed to thread the film into the nip can be shorter or omitted completely. Consequently, considerably more color separations than formerly can be prepared from the same quantity of color film. The yield from the supply roll increases.

As the supply roll and the waste roll are permanently connected by a length of color film in normal operation, the effort of manually manipulating the end of the color film is eliminated. Only insertion of the cassette into the laminator is required. Then lamination can begin immediately. Because a knife or a similar device is not needed to separate the used color film from the supply role, the risk of injury to the technician is reduced. A further advantage is that the technician has practically no contact with the color film. Therefore, hands and work clothing are contaminated less often. The straight edge serves to strip the color film away from the image-bearing film. The sharp deflection produces on the color film a force that operates at a relatively sharp angle to the plane of the nip. The straight edge reliably separates the color film from the image-bearing film, even in the tacky areas.

A deflection angle equal to or greater than 70° is preferred. This achieves a very sharp path deviation in the color film, which is stripped away almost perpendicularly from the image-bearing film immediately beyond the straight edge. It is preferable to install the straight edge with adjustable deflection capability.

It is advantageous to attach a deflection guide to the straight edge. Thus, the color film runs between the straight edge and the guide. By means of the guide, the travel path of the color film can be more accurately controlled and the deflection defined more precisely.

The guide is formed preferably from sheet metal. The sheet metal distributes the forces acting on the color film more uniformly and is particularly suitable for thinner papers.

It is desirable to provide for the color film a feed guide that can be shifted between at least two positions to change the path of the color film at least in the area of the opening. The feed guide for the color film serves particularly to change the path of the color film whenever the cassette is to be inserted into the laminator. When the roller nip is open, a specific place is available into which the color film can be inserted. However, because, on one hand, the color film should be under tension, while, on the other hand, the corresponding laminator roller should merely rest on the color film, the color film would under the circumstances stick to this roller when the cassette is inserted into the laminator. With the use of the feed guide for the color film, the path of the color film can be changed so that the color film can bypass the roller involved. After the cassette is placed in the laminator, the feed guide for the color film can be brought into another position so that the color film can assume its operating position.

In this connection, it is advantageous for the feed guide for the color film to have a bar extending perpendicularly to the travel direction of the color film. The bar is supported on both sides in gears supported rotatably in the housing so that the axes of both gears lie on a straight line. An operating device is provided to rotate both gears synchronously. By means of the gears, the bar can be shifted between the two positions. When the bar is in the operating position, it is advantageous for it not to be in contact with the color film. However, if it is, this is not a disadvantage, because the color film can slide freely on the bar. Having the operating apparatus rotate both gears synchronously assures that the rod is always extended in a direction perpendicular to the travel direction of the color film. This prevents canting or distortion in the color film.

It is advantageous for the operating device to have an operating axis running through and supported in the housing, on which axis are affixed integrally two toothed gears that mesh with the teeth of the gears on the bar. The necessary torque is transmitted through the operating axis without twisting the feed guide for the color film.

At this point, it is preferable to have a deflection roller supported rotatably on the operating axis. As the color film must usually travel around the operating axis, the deflection roller simplifies color film transport.

It is also preferable for the operating axis to go through both sides of the housing. On one end a handle and on the other end a shift lever are attached integrally to the operating axis. The operating axis can be rotated by means of the handle. One result is that this enables shifting the feed guide for the color film from one position, the insertion position, to the other position, the operating position. In the inserted cassette position, the color film lies on the corresponding roller of the nip. Another result is that the shift lever is also operated through the handle. The shift lever actuates a switch circuit to show that the cassette is inserted and optionally, what color. The shift lever can simultaneously actuate or release a mechanical locking mechanism that prevents removal of the cassette from the laminator. The latter becomes possible only if the handle is rotated to another position at which the feed guide for the color film is in the insertion position and the locking mechanism is released.

A preferred embodiment has a supply roll and a waste roll each with a roll braking apparatus that brakes each roll if no external force is applied. As long as the cassette is outside the laminator, no forces are applied to either of the roll braking devices. Therefore, the roll braking devices brake the supply roll and the waste roll. The color film remains in its previously set condition, because neither the supply roll nor the waste roll can be wound or unwound. In particular, the tension of the color film is maintained. Thus, the color film can be processed further immediately after the cassette is placed in the laminator.

The preferred roll brake is a friction coupling with one surface touching the housing and the other surface touching the roll. A friction coupling can brake the roll at any angle of rotation. However, the roll does not become locked, that is, rotation is possible, if necessary, whenever a rotary torque acting on the roll exceeds the braking torque. The braking torque can be adjusted so that the color film is not torn whenever a certain force acts on the film. It is advantageous for the roll brake to be equipped with a pretensioned actuating mechanism that brings the friction surfaces into contact with one another in the standstill position. Thus, the roll brake is released only when the actuating member is operated. Because the actuating member is pretensioned, it assumes its standstill position only if no external forces act on the cassette or the actuating member. This is always the case when the cassette is removed from the laminator. The pretensioning has the advantage that when the cassette is removed from the laminator, that is, when the forces on the actuating member are reduced, the roll brake engages, thus braking the supply roll or the waste roll.

An advantageous embodiment of the housing has two interconnected side walls in which the supply roll and waste roll are supported rotatably and at least one of them has a cutout extending from the edge between the supply roll and the waste roll. This embodiment can be inserted sideways in the laminator, that is, in the direction of the axes of the rollers forming the nip. The opening is provided so that the cassette can bypass one of the two rollers. The other roller is then located under or over the cassette. This enables relatively easy maintenance of the regulating distance for the rollers forming the nip. The nip must be smaller than the height of the cassette.

It is preferable for the side walls to be higher than the largest roll diameter and for the cutout to be at least as high as the largest roller diameter. This assures that the nip roller for which the cutout is provided can be low enough relative to the cassette that it is below the length of color film between the supply roll and the waste roll. Instead of the roller being lowered, the color film can also be raised.

To support the waste roll and the supply roll, it is preferable for the side walls for the supply roll and the waste roll to each have a bearing slot extending from the edge to hold a roller axle journal. The supply roll and the waste roll can thus be set into the cassette from one edge. The axle journals can be fitted into the slot. In this manner, the axle journals are enclosed on at least three sides, thus assuring relatively good positioning of the supply roll and the waste roll.

The supply roll and/or the waste roll have preferably a core that is hollow at least at the ends into which the axle journals are inserted. The supply roll and/or the waste roll can also be made exactly as wide as the color film. Supporting them is then accomplished by journals plugged in externally. This simplifies transport and storage of the supply rolls and/or waste rolls because they can be stacked closely together. In this case, it is preferred that the axle journals have radial teeth extending axially on the ends fitting into the core. These teeth form at the least a tensioned, but in most cases an interlocking connection between the journals and core. This assures that the rolls are firmly connected with the axle journals and that the connection can be released. In another alternative, the core has a number of torque-engaging surfaces on its inner wall and the journals have negative interfitting engaging surfaces. For example, the core can have a cutout with a hexagonal or octagonal cross-section. The journals have a corresponding hexagonal or octagonal shape. This enables torque transfer from the journals to the roll; yet the connection between the journals and the roll can be released.

This is particularly advantageous if at least the waste roll can be driven. Then only the axle journals have to be driven. The torque moment is transferred to the waste roll by the slits or the torque-engaging surfaces in the core. If the waste roll is driven, the used color film can be wound up trouble-free after lamination. For drive purposes, the waste roll journal on the side of the housing with the cutout can have a cone with a friction contact surface positioned on the outside of the housing. A tensioned connection with a drive in the laminator is produced through the cone. The cone has the advantage of allowing a certain tolerance in placing the cassette into the laminator. As long as the tip of the cone can fit into the associated cutout, the friction surface on the outside of the cone will contact its corresponding mating surface thus assuring engaging the waste roll. Another example of the drive mechanism can be an axle journal with an eccentrically-placed pointed pin that, when the cassette is installed in the laminator, slips into one of several holes of a perforated flange located on the waste roll drive.

A cover should be provided for each the supply roll and/or the waste roll to at least partially enclose the associated roll. This cover protects the roll. It can be closed after the roll is set in place. The cover can have a side wall that fits with the axle journal when the cover is closed. Thus, the journal is also certain to be in the same orientation as the long slot in the housing side wall. When the cover is closed, the roll, that is, the supply roll or the waste roll, cannot fall out of the housing.

The cover is preferably hinged pivotably to the housing. Thus, it cannot be misplaced. It is simply pivoted open to load the supply roll and waste roll into the housing. After the rolls are in place, the cover can be closed and locked.

It is advantageous for the straight edge to be built into the cover near the waste roll. When the cover is closed, the straight edge is automatically in the correct position. As soon as the cover is locked, the cassette can operate as planned.

A sensor to measure the diameter of the supply roll is desirable. With the sensor, the amount of color film on the supply roll can be monitored automatically. The technician is given timely warning when the amount of color film on the supply roll is running low.

A preferred embodiment has a movable shutter that protects the color film in the area of the opening and is shifted to unblock the opening in the housing when the color film supply apparatus is placed in the laminator. In particular, this greatly simplifies the handling of light-sensitive color films. The cassettes can now be handled in normal illumination, either daylight or artificial light, without concern about protecting the color film from light.

BRIEF DESCRIPTION OF THE DRAWINGS

The invention can be more fully understood from the following detailed description thereof in connection with accompanying drawings described as follows.

DESCRIPTION OF THE PREFERRED EMBODIMENT(S)

Figure 1:
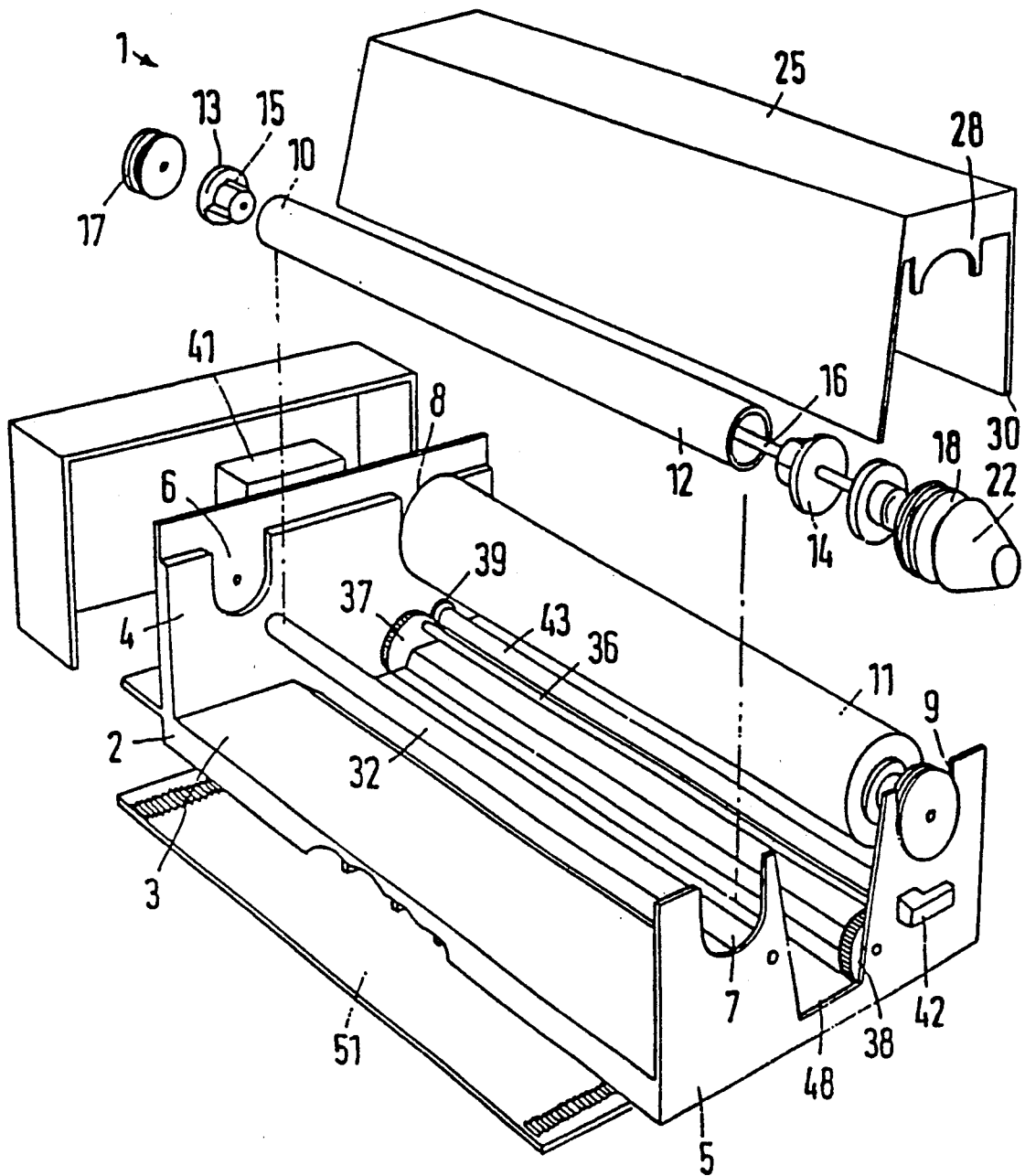
FIG. 1 is an overall view of a cassette, partially exploded.

Throughout the following detailed description, similar reference characters refer to similar elements in all figures of the drawings.

A color film supply apparatus is shaped as a cassette 1 with a housing 2 with a bottom 3 and two side walls 4, 5. Each side wall 4, 5 has two longitudinal slots 6, 7, 8, 9 extending from the upper edge of the side walls 4, 5. The longitudinal slots 8, 9 form a support for a supply roll 11.

Figure 7:
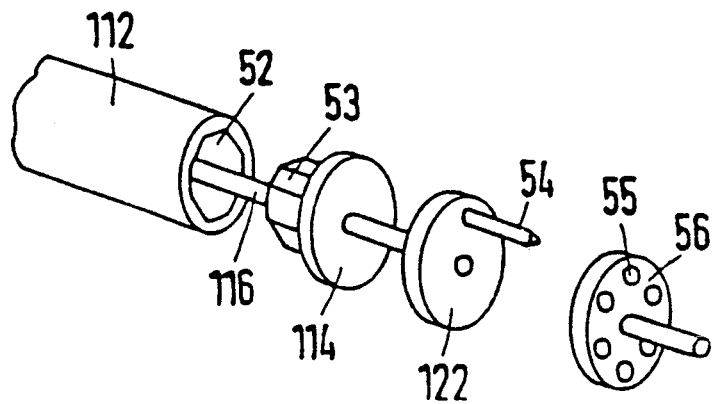
FIG. 7 is another roll bearing section embodiment, exploded.

Supply roll 11 and waste roll 10 have a core 12 that is hollow at least at the ends. Axle journals 13, 14 are inserted into both ends of the core 12. Each axle journal 13, 14 has a series of teeth 15 oriented radially and extending axially. These teeth 15 extend partially into the core 12 of the roll 10 to produce a tensioned or interlocking connection between the axle journals 13, 14 and the core 12. FIG. 7 shows an alternative connection between the axle journals and the core, the corresponding parts being labelled with the same reference numbers raised by 100. The core 112 is similarly hollow. A cavity 52 through the core 112 has an octagonal cross-section. The axle journal 114 has, instead of teeth, an extension 53 that is also octagonal in cross-section. The extension 53 is shaped so that it fits into the opening cavity 52 of the core 112. Torque can be transmitted through the eight surfaces of the extension 53. Referring back to FIG. 1, both axle journals 13, 14 are connected together by an axle shaft 16. The axle shaft 16 is joined integrally at least with one axle journal 13, 14. In addition, the axle shaft 16 has, beyond the journals 13, 14, bearing bushings 17, 18 which are not rotatable with respect to the side walls 4, 5 of the housing 2 and in which the axle shaft 16 can rotate freely.

Figure 4:
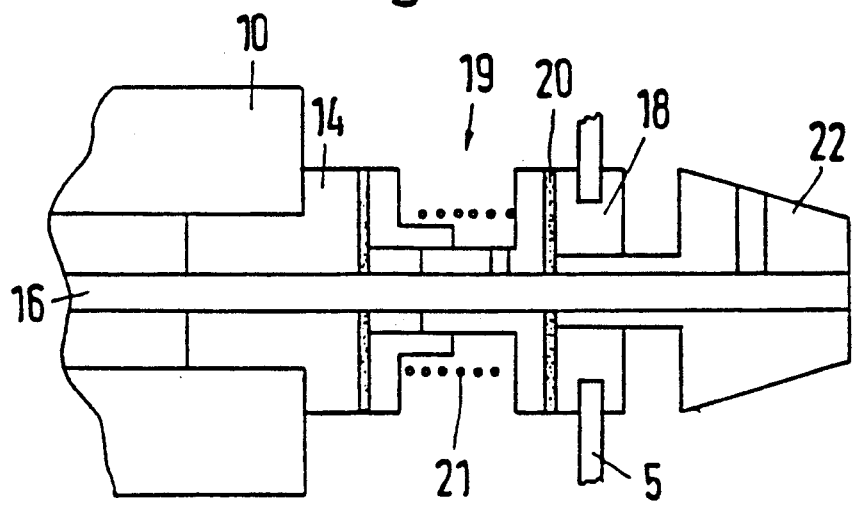
FIG. 4 is an enlarged view of a roll bearing section from FIG. 3.
Figure 5:
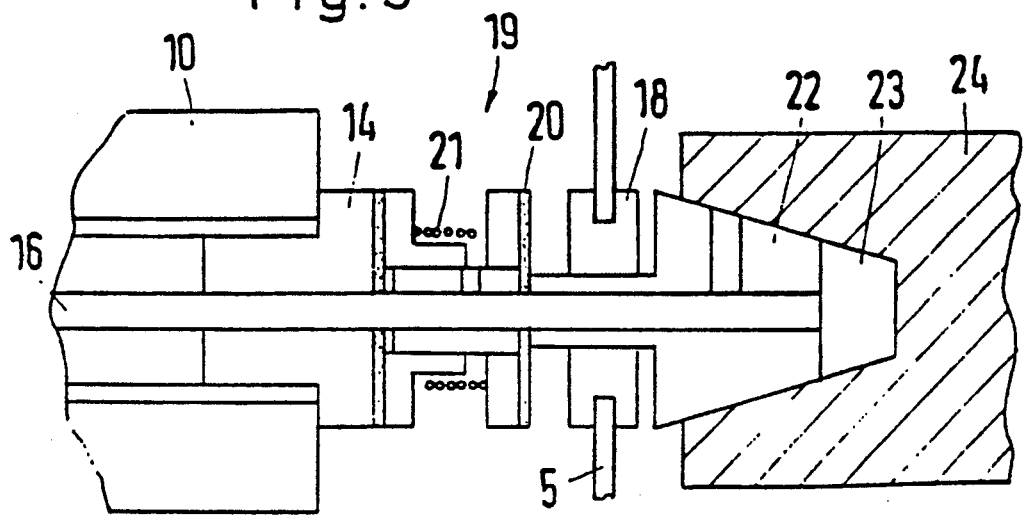
FIG. 5 is the roll bearing section from FIG. 4 in another operating position.

A braking device 19 is also located on the axle shaft 16 and is explained in more detail in connection with FIGS. 4 and 5. The roll braking device 19 is shaped as a friction coupling, that is, it has a friction surface 20 that is pressed by the force of a spring 21 against the side wall 5 of the housing 2 or against the bearing bushing 18 non-rotatably fixed in the housing 2. As long as the spring 21 is relaxed, that is, as long as no external forces act on the axle shaft 16, the waste roll 10 is braked by the friction lock between the friction surface 20 and the bearing bushing 18. Only one friction lock is involved here. This has the advantage that the waste roll 10 can be braked in any angle of rotation. In addition, the waste roll 10 can also be rotated despite the friction lock, whenever a torque exceeding the braking torque is applied to the waste roll 10. The braking torque is selected to be only high enough so that the torque transmittable with the aid of the color film requires lower forces than would be required to tear the film. Thus, if the color film gets stuck because of awkward handling, the film is not torn. Rather, it unwinds from the waste roll 10.

The roll braking device 19 is released when the cassette 1 is placed in a laminator. In this case, a cone-shaped actuating member 22 is displaced inwards against the force of the spring 21, that is, towards the housing 2. The friction surface 20 is thereby released from the sidewall 5 or the bearing bushing 18. This eliminates the frictional force. It is advantageous here to have the actuating member 22 fit into a correspondingly conical cutout 23 of a drive 24 in the laminator. The conical shape allows a certain degree of self-centering capability, so that the placement of the cassette 1 in the laminator has some free play. When the drive 24 is rotated, the waste roll 10 is rotated simultaneously by the actuating member 22 that is joined integrally with the axle shaft 16. On lamination, this can wind the color film automatically on the waste roll 10.

FIG. 7 shows an alternative for the drive. Instead of a cone 22, a disk 122 is provided with a pointed pin 54 placed eccentrically on the disk 122. When the cassette 1 is placed in the laminator, the pin 54 is inserted into a hole 55 of a drive disk 56. When the drive disk 56 is rotated, a drive torque is transmitted through the pin 54 to the shaft 116.

When the cassette 1 is removed from the laminator, the actuating member 22 is released from the drive 24 and the spring 21 forces the coupling surface 20 back into friction contact with the bearing bushing 18. The waste roll 10 and the supply roll 11 are thus automatically braked.

Referring to FIG. 1, cassette 1 also has a displaceable shutter 51 attached to the housing 2. This shutter 51 covers an opening 48 as is necessary for light-sensitive color film. When the cassette 1 is inserted into the laminator, the shutter 51 is shifted in the housing 2 to unblock the opening 48.

Figure 2:
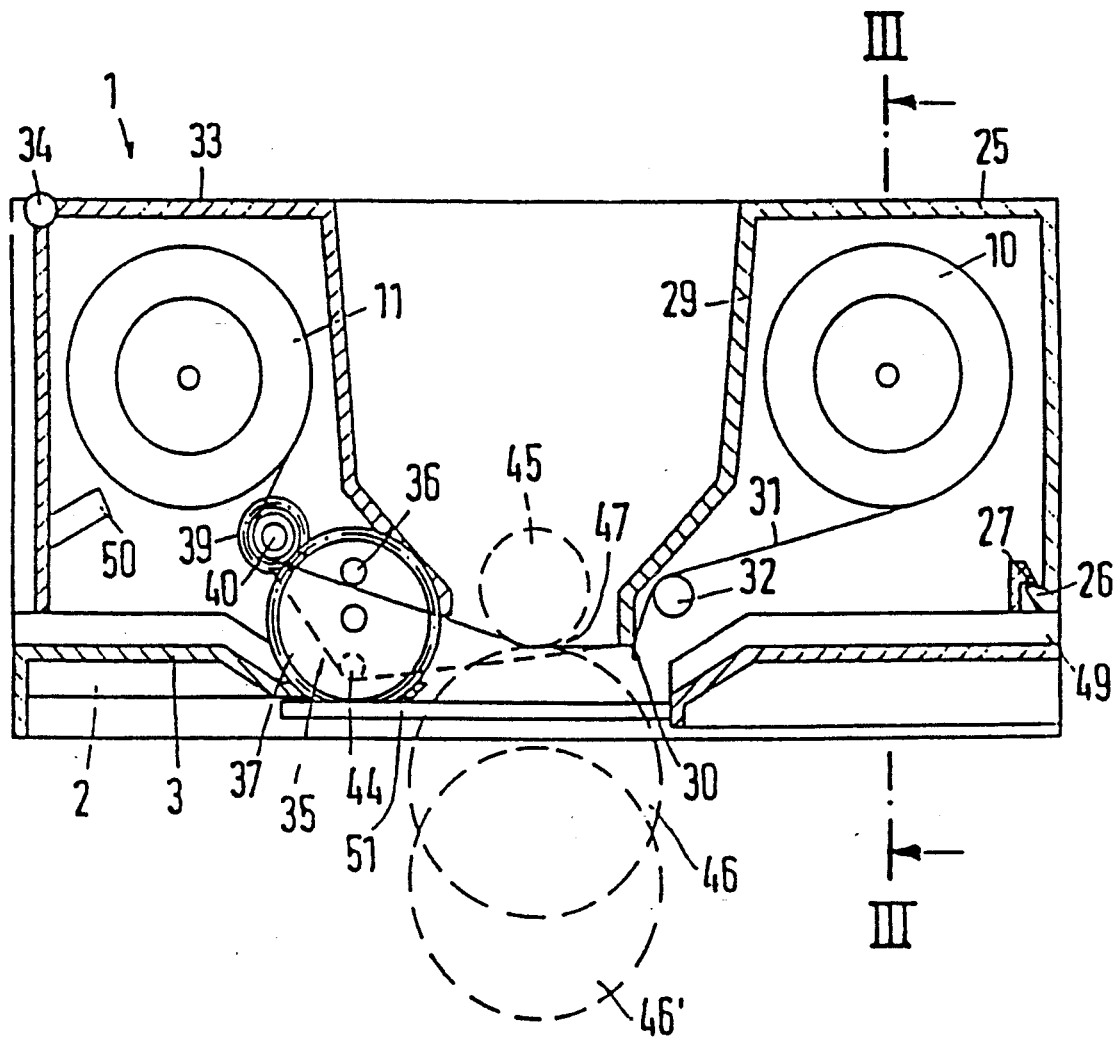
FIG. 2 is a cross-section of a cassette.
Figure 3:
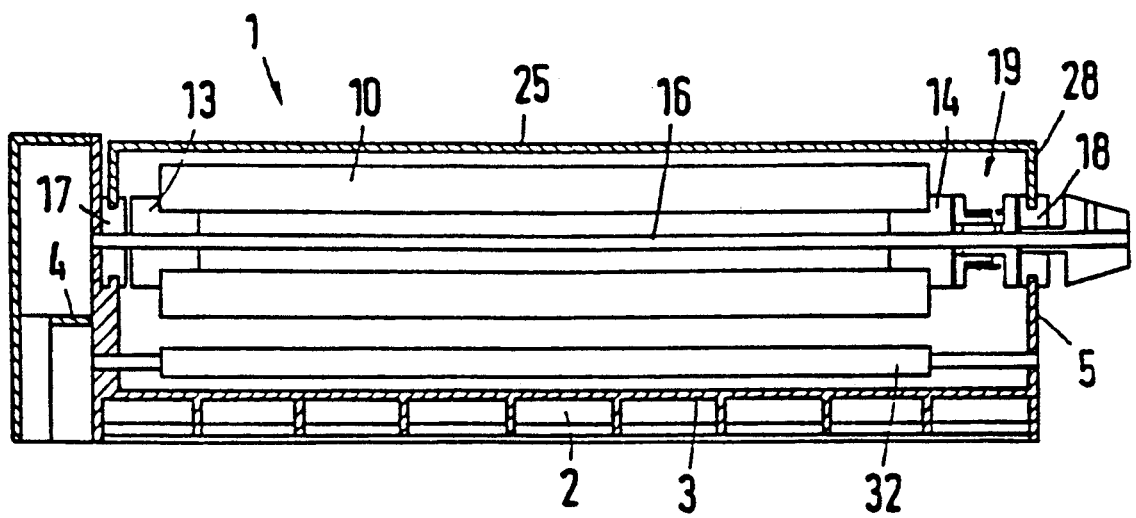
FIG. 3 is a cross-section at III—III in FIG. 2.

Referring to FIGS. 1 and 2, the waste roll 10 is provided with a cover 25 that can be plugged onto the housing 2. After the cover 25 is on, a lip 26 on it is engaged under an overhang 27, thus fastening the cover 25 to the housing 2. The cover 25 can be removed easily from the housing 2 by slight bending pressure on a wall bearing the lip 26. The housing 2 protects the waste roll 10, that is, it reliably prevents the technician from accidentally touching the waste roll 10. Referring to FIGS. 1 and 3, on each side, the cover 25 has a side wall 28 wherein the bearing bushing 18 is affixed in the longitudinal slot 7. The same applies to the other longitudinal slots 6, 8 and 9 in the corresponding side walls 28 of the cover 25. This prevents the waste roll 10 and the supply roll 11 from sliding upwards.

Referring to FIG. 2, on a transverse wall 29 adjacent to the supply roll 11, the cover 25 has a straight edge 30 that produces a sharp bend in the web of a color film 31 running between the supply roll 11 and the waste roll 10. For better control of this bend, a deflection device in the form of a deflection roller 32 can be located in the area of the straight edge 30 to conduct the color film 31 directly upwards after coming off the straight edge 30. The angle created by the straight edge 30 is preferably greater than 70°.

Figure 6:
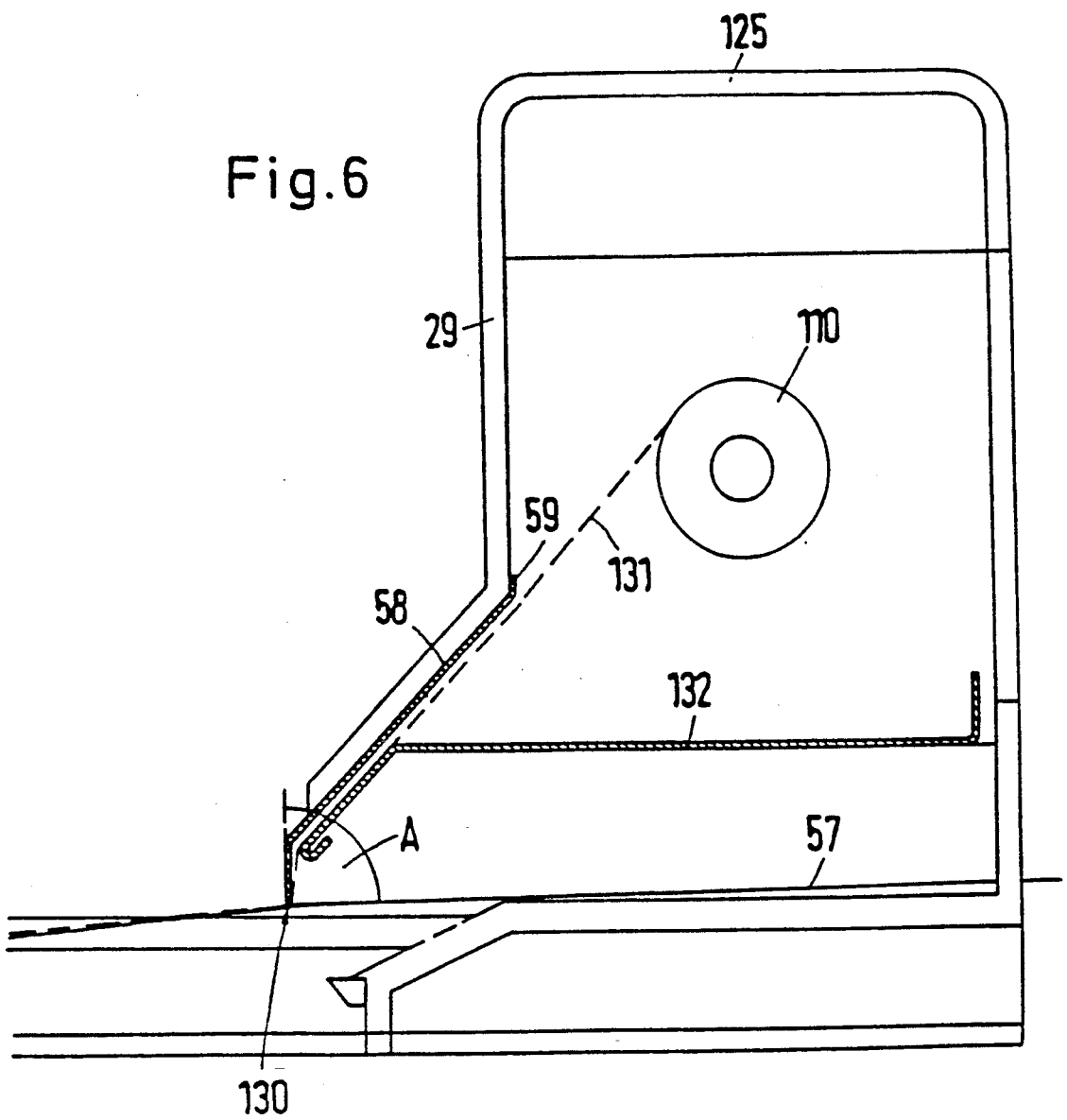
FIG. 6 is a cross-section of another cassette embodiment.

FIG. 6 shows another embodiment in which the deflection device is a metal sheet 132. In FIG. 6, the elements corresponding to those in FIGS. 1 and 2 are labelled with the same reference numbers raised by 100. The angle produced by the straight edge 130 is also labelled here as angle A. The almost vertical angle at which the color film 131 is stripped from the image-bearing film 57 is shown clearly. The metal sheet 132 is particularly effective for thin papers. The force acting on the color film 131 is more uniformly distributed. The wind orientation of the waste roll 110 is opposite that of FIG. 2. For this reason, the straight edge 130 is part of a metal sheet 58, the upper end of which is a rounded lip or bend 59. As the diameter of the waste roll 110 increases, the color film 131 can slide along the rounded lip or bend 59. In this instance also, the straight edge 130 is incorporated in the cover 125 on the waste roll 110.

The supply roll 11 also has a cover 33 as seen in FIG. 2. The cover 33 is linked to the housing 2, that is, it is joined to the housing 2 pivotably through a hinge 34. Thus, the housing 2 has an attached cover 33 that cannot be misplaced. However, the cover 33 can also be detachable like the cover 25. Conversely, the cover 25 can also be linked to the housing 2, like the cover or otherwise. Exactly like the cover 25, the cover 33 has on each side a side wall, not shown, with bearing bushings located in the longitudinal slots 8, 9 of the side walls 4, 5 of the housing 2.

The housing 2 also has a color film feed guide 35. The color film guide 35 has a bar 36 joined on each end to a gear 37, 38. The two gears 37, 38 mesh with the drive gears 39 that are joined integrally with an operating axle 40. Referring to FIG. 1, the operating axle 40 has on one end a handle 41 and on the other end a shift lever 42, which are joined integrally with the operating shaft 40 shown in FIG. 2. In addition, the operating shaft 40 has an adjustable deflection roller 43.

When the handle 41 is moved, the operating shaft 40 is rotated. At this, the gears 37, 38 are rotated synchronously by the drive gears 39. The bar 36 is moved from the position shown by the solid line into the position 44 shown by dashes in FIG. 2, to exert pressure on the color film 31. As a result, the color film 31 is deflected to a predetermined degree in the area between the two covers 25, 33. Simultaneously, the shift lever 42 is rotated.

The use of the cassette 1 is illustrated with the aid of the example shown in FIG. 2. The cassette 1 to be used in a laminator has two rollers, specifically an upper roller 45 and a lower roller 46, which together form a roller nip 47. Before the cassette 1 is inserted into the laminator, the lower roller 46 is lowered to position 46'. Thereby, the roller nip 47 is enlarged. Before the introduction of the cassette 1, the color film guide 35 is actuated, that is, the bar 36 is rotated into position 44. This lowers the color film 31 enough to pass freely under roller 45. The cassette 1 can now be inserted sideways into the laminator, that is, in the direction of the longitudinal axis of the rollers 45, 46. When this is done, the upper roller 45 protrudes into the opening 48 in the side wall 5 of the housing 2. Because the color film 31 has been lowered by the color film feed guide 35, the color film 31 does not rest on roller 45.

After the cassette 1 is inserted, the color film feed guide 35 is actuated by the handle 41. This not only moves the bar 36 out of position 44, but it also moves the shift lever 42, which can actuate a switch, not shown in detail, in the laminator and activate a mechanical locking mechanism that prevents removal of the cassette 1 from the laminator. The lower roller 46 is then moved upwards and the roller nip 47 is closed. The rollers 45 and 46 are at least partially within cassette 1 because they protrude into the cassette 1 from above and below through an opening in the cassette 1 located between the supply roll 11 and the waste roll 10, an opening at least as wide as the color film 31, and they can be brought into contact with the color film 31.

An image-bearing film is placed beforehand in the roller nip 47. Drive power is then applied to the lower roller 46, forwarding the color film 31 together with the image-bearing film through the roller nip 47. Shortly after exiting the roller nip 47, the color film 31 is stripped from the image-bearing film by the action of the straight edge 30. The straight edge 30 exerts on the color film 31 a force that is directed essentially upwards, thus away from the image-bearing film located in the plane of the roller nip 47. The image-bearing film with the desired color coating on the areas previously rendered tacky appears in an outlet 49 of the housing 2 without the color film 31 requiring further handling. After the application of the first color, the cassette 1 is changed, that is, the roller nip 47 is opened, the handle 41 is turned to release the shift lever 42 from its locked position, the bar 36 is dropped into position 44, and the cassette 1 can be removed from the laminator. Another cassette with another color is inserted into the laminator. The surface of the image-bearing film is rendered tacky in other areas that are to accept another color and passed again through the laminator.

The cassette 1 has a sensor 50 that measures the diameter of the supply roll 11. An indicator can be provided to show the diameter and to give a technician timely warning when the supply of color film 31 on the supply roll 11 runs low. The technician can punctually use a new cassette or insert a new supply roll 11 into the cassette 1. The used color film is then wound on the waste roll 11 and can be recycled completely.

Those skilled in the art, having the benefit of the teachings of the present invention as hereinabove set forth, can effect numerous modifications thereto. These modifications are to be construed as being encompassed within the scope of the present invention as set forth in the appended claims.

What is claimed is:

1. Color-bearing film supply apparatus, comprising:
   a supply roll for holding unused color film;
   a waste roll for holding used color film;
   a cassette-type, portable housing supporting the supply roll and the waste roll, such that when one end of an elongated sheet of the color-bearing film is wound on the supply roll and another end of the elongated sheet is wound on the waste roll, a length of the color-bearing film extends between the supply roll and the waste roll;
   the housing having between the supply roll and the waste roll an opening at least as wide as the color-bearing film which permits free access to both sides of the color-bearing film;
   a straight edge that operates on the length of the color-bearing film and deflects a travel path of the color-bearing film; and
   a deflection device that operates on the length of the color-bearing film and controls the deflection of the travel path of the color-bearing film independent of the amount of used color film held on the waste roll.

2. The apparatus in accordance with claim 1, wherein the straight edge deflects the film an angle equal to or greater than 70°.

3. The apparatus in accordance with claim 1, wherein the deflection device is formed from a metal sheet.

4. The apparatus in accordance with claim 1, further comprising:
   a color film feed guide; and
   means for shifting the feed guide between two positions to change the path of the color film at least in the area of the opening.

5. Color-bearing film supply apparatus, comprising:
   a supply roll for holding unused color film;
   a waste roll for holding used color film;
   a cassette-type, portable housing supporting the supply roll and the waste roll, such that when one end of an elongated sheet of the color-bearing film is wound on the supply roll and another end of the elongated sheet is wound on the waste roll, a length of the color-bearing film extend between the supply roll and the waste roll;
   the housing having between the supply roll and the waste roll an opening at least as wide as the color-bearing film which permits free access to both sides of the color-bearing film;
   a straight edge that operates on the length of the color-bearing film and deflects a travel path of the color-bearing film;
   a color film feed guide having a bar extending perpendicularly to the direction of travel of the color film, the bar supported on both sides in first rotatable gears each supported rotatably in the housing, whereby axes of the first gears lie in a straight line and an actuating device is provided to rotate the first gears synchronously; and
   means for shifting the feed guide between two positions to change the path of the color film at least in the area of the opening.

6. The apparatus in accordance with claim 5, wherein the actuating device having a continuous operating axle supported in the housing; further comprising two second rotatable gears on the operating axle that mesh with the external teeth on the first gears.

7. The apparatus in accordance with claim 6, further, comprising a rotatable deflection roller.

8. The apparatus in accordance with claim 6 or 7, characterized in that the operating axle goes through both sides of the housing, with a handle on one end and on the other end a shift lever joined integrally with the axle.

9. The apparatus in accordance with claim 1, further comprising a braking device for each one of the supply roll and the waste roll such that the braking device brakes the respective rolls without an external force being applied to the braking devices.

10. The apparatus in accordance with claim 1, wherein the housing has two attached side walls in which the supply roll and the waste roll are rotatably supported and at least one of which has an opening defined by a side wall edge between the supply roll and the waste roll.

11. The apparatus in accordance with claim 10, wherein the side walls are higher than the largest roll diameter and the height of the opening corresponds at least to the largest roll diameter.

12. The apparatus in accordance with claim 10, wherein the side walls each have, defined by the side wall edge, a slot supporting axle journals of the rolls.

13. The apparatus in accordance with claim 12, wherein at least one of the supply roll and the waste roll has at least on ends a hollow core into which the axle journals are inserted.

14. The apparatus in accordance with claim 1, further comprising means for driving at least the waste roll.

15. The apparatus in accordance with claim 1, further comprising a cover for at least partially encircling at least one of the supply roll and the waste roll.

16. The apparatus in accordance with claim 15, wherein the cover is pivotally hinged to the housing.

17. The apparatus in accordance with claim 15, wherein the straight edge is incorporated in the cover for the waste roll.

18. The apparatus in accordance with claim 1, further comprising a sensor for determining the diameter of the supply roll.

19. The apparatus in accordance with claim 1, further comprising a movable shutter for protecting the color film in the area of the opening, the shutter being displaceable in the housing to unblock the opening when the color film supply apparatus is placed into a laminator.

* * * * *